United States Patent
He et al.

(10) Patent No.: US 8,217,099 B2
(45) Date of Patent: Jul. 10, 2012

(54) THERMOSETTING RESIN COMPOSITION

(75) Inventors: Yufang He, Guangdong (CN); Lijun Su, Guangdong (CN)

(73) Assignees: ITEQ (Dongguan) Corporation, Guangdong (CN); ITEQ Corporation, Taoyuan (TW)

(*) Notice: Subject to any disclaimer, the term of this patent is extended or adjusted under 35 U.S.C. 154(b) by 285 days.

(21) Appl. No.: 12/125,430

(22) Filed: May 22, 2008

(65) Prior Publication Data

US 2009/0292062 A1 Nov. 26, 2009

(51) Int. Cl.
- *C08L 63/00* (2006.01)
- *C08L 25/04* (2006.01)
- *C08K 3/20* (2006.01)
- *C08K 3/22* (2006.01)
- *C08K 3/28* (2006.01)
- *C08K 3/34* (2006.01)
- *C08K 3/36* (2006.01)
- *C08K 3/38* (2006.01)
- *C08K 3/40* (2006.01)

(52) U.S. Cl. ........ 523/466; 523/445; 523/457; 523/458; 525/523; 525/524; 525/525; 525/527; 525/529; 525/530; 525/533; 525/540

(58) Field of Classification Search .................. 525/523, 525/529, 530, 533, 540, 524, 525, 527; 523/427, 523/428, 429, 433, 445, 457, 458, 466
See application file for complete search history.

(56) References Cited

U.S. PATENT DOCUMENTS

| | | | |
|---|---|---|---|
| 6,509,414 B2* | 1/2003 | Tikart et al. | 525/115 |
| 7,521,494 B2* | 4/2009 | Choate et al. | 523/434 |
| 2002/0082350 A1* | 6/2002 | Tikart et al. | 525/119 |
| 2005/0250916 A1* | 11/2005 | Choate et al. | 525/530 |
| 2007/0178300 A1* | 8/2007 | Amla et al. | 428/332 |

* cited by examiner

*Primary Examiner* — Michael J Feely

(57) ABSTRACT

A thermosetting resins composite, composed of: epoxy resin which can have a total polymerization with bismaleimide, occupying 1.75%-18.0% solids weight of the composite; bismaleimide compounds, occupying 0.15%-12.5% solids weight of the composite; free radical initiator, its mole fraction of which its addition accounts for reaction monomer total is 0.01%-0.15%; inhibitor, whose amount is the half to double of the initiator; styrene-maleic anhydride copolymers, occupying 17.5%-47.0% solids weight of the composite; filler, occupying 20%-60% solids weight of the composite; solvent, occupying 30%-50% solids weight of the composite; flame retardant which can be used in CCL industries.

13 Claims, No Drawings

THERMOSETTING RESIN COMPOSITION

BACKGROUND OF THE INVENTION (a) Field of the Invention

The present invention involves a kind of thermosetting resin composition, specifically a high performance resin composition corresponding to the packaging requirements for electronic components and Integrated Circuits (IC).

(b) Description of the Prior Art

Increasing demands on light-weight, small-scale and high densification for electronic and communication products calls for the improvements of printed circuit board in thinning and microporosity techniques. In addition to continued improvement with miniaturization of Surface Mounting Technology (SMT), the demand on high quality IC package substrate is boosted constantly.

For conventional IC packages, the wire frame is used as the IC conducting circuit and the vehicle for IC, connected to the pins on sides or circumference. With the development of IC package technology, the increase of the number of pins (over 300 pins), the routing density augment, and the increase of the number of layers of substrates, limit its development for the traditional package method such as QFP (Quad Flat Package) etc. In the mid 90s of 20th century a new type of IC package method represented by BGA (Ball Grid Array Package), CSP (Clip Scale Package) comes out, along with yielding a new necessary carrier for semiconductor chip package, i.e. IC package substrate (also named IC package carrier).

For the past years, IC package substrate as BGA, CSP and FC (Flip Chip) modes is expanded rapidly and widely in its application field. In the world, the strong competitive situation is going on in the market of package substrate in the countries and regions to deal with the package manufacturing. The competition is with focus on fully applying high density multilayer substrate technique to IC package and reducing the cost of manufacturing package substrate.

To develop the substrate material used for IC package carrier (also named IC package substrate) is a very important task currently. Along with the development of IC package towards high frequency, and low electric energy consumption, the major performance of IC package substrate such as low dielectric constant, low dielectric loss factor, and high thermo-conductivity will be improved. An important direction for studying IC package carrier is effectual heat coordination and integration such as heat connection techniques and heat dispersal of substrate. The great amount of heat generated with power consumption by electronic components would lead to an increase in the temperature of device. In general, the probability of 0.0 invalidation for a device increases 2~3 times for every 18° C. temperature rise. Therefore it is particularly important to solve the problem about heat dissipation by improvement of the heat conducting performance of package material, and to assure normal operation of the circuit within the operating temperature range.

The other problem to be solved is that the coefficient of thermal expansion for IC package carrier is incongruent with it of semiconductor chips. Even if the build-up multi-layer boards suited for minuteness circuit manufacturing technology, the problem about common excessive thermal expansion coefficient of insulated substrate (typically the thermal expansion is about 60 ppm/° C.) still exists. To make the coefficient of thermal expansion of substrate reach 6 ppm or so near that of semiconductor chips is surely a "formidable challenge".

The development of IC package design and manufacturing technique demands requirements with substrate materials used for it. These are shown mainly in the following aspects: 1) high Tg and high thermotolerance corresponding the lead-free fluxes; 2) the property of low dielectric loss factor requiring to reduce the signal transmission loss; 3) low dielectric constants for speedup; 4) low warpage (improvement of the flatness of substrate surface); 5) low hydroscopicity; 6) low coefficient of heat expansion, making it close to 6 ppm; 7) low cost of the IC package substrates; 8) low cost of the built components; 9) high strength characteristics at high temperature; 10) the environmentally friendly substrate material to lower the cost suited for lead-free reflow soldering process.

Most of substrate used for IC package is made up of organic resins. Resins such as epoxide resin, acrylate resin, cyrante resin and bismaleimide-triazine (BT) resin have been used in this field.

Epoxide resin is the most common resin to be used; it has the advantages of easy processing, good cohesive property with all substrates, high chemical resistance, corrosion resistance, and excellent mechanical property etc. But the performance of epoxide resin at high temperature is not good enough, mainly higher dielectric constant (for example, the epoxide resin-basic package carrier E-679F developed by Hitachi Chemical Co., Ltd. has dielectric constant of 4.85 and 4.53 corresponding at frequency 1 MHz and 1 GHz respectively) and greater water absorption rate. Epoxide resin is cured with amides and anhydrides normally, so that the cured material inevitably contains considerable amount of hydrophilic groups as hydroxyl group, leading to greater water absorption rate of the material. Therefore, the cured epoxide resin is very sensitive to water at high temperature and high humidity.

The performance of cyrante resin has a reasonable improvement compared to conventional epoxide resin. Cyrante resin is required usually in order to obtain a high cross-linking density, a high glass transition temperature (Tg) and a lower dielectric nature. However, cyrante resin has a high cost and weaknesses such as high brittleness, high water absorbtivity after it cured.

Another primary resin is bismaleimide. It has the characteristic that the physical property remained considerable excellent at high temperature and high humidity, and steady electric property within wide range of temperature (no fluctuations). This characteristic makes bismaleimide ideal for use in the field of advanced complex material and electronics, electrical appliances. Bismaleimide has good damp and hot performance at high temperature of 230-250° C. But bismaleimide is insoluble in conventional organic solvents normally, so difficult for processing. Further more, the weaknesses for bismaleimide that the curing condition too severe and too great brittleness which makes easy produce microcracks under thermal shock also exist.

Popularly, bismaleimide is used in combination with cyrante, to get the usually so-called BT resin. This kind of resin was developed and patented by Mitsubishi Gas Co., Ltd. Japan at the earliest (U.S. Pat. No. 4,110,364). Bismaleimide-triazine resin (BT resin, for short) is a high polymer resin resulted from copolymerization of cyanate resin with —OCN (CE) and bismaleimide resin (BMI) at 170-240° C. The finalized high polymer is composed of N-heterocyclic structure with high heat resistance as triazine ring, imide ring etc. The solids of such BMI/CE copolymer have impact resistance, electricity insulativity (shown mainly at low $\in$, low tan δ) and process operationables as BMI resin, as well as improved water resistance of cyanate resin simultaneously, and maintain high heat resistance possessed by the both.

Since the substrate material made from BT resin is the best in PCT (Pressure Cooker Test) resistance, metallic ion migration resistance, heat resistance, dielectric property, humidity resistance and elevated temperature impact property, specially its mechanic properties at high temperature (including mainly flexural strength, elastic modulus, copper foil adhesive strength and surface hardness etc. at high temperature) have more outstanding advantage compared with the substrate materials made from other resins (such as the substrate materials made from common epoxide resin, polyimide resin, polyphenyl ether resin), therefore the insulation reliability and technical processability for chip setting and high density wire laying on IC substrate package application are improved, thus the substrate material made of BT resin makes up a major part of all kinds of substrate material.

The high crosslinking density of BT resin after polymerization, plus the high symmetrical triazine molecular ring structure, and high crystallinity, bring about more brittle solids, and a raised cost resulting from complicated syntheses process of cyrante resin (CE) used; increasing ductility and processability and reducing the cost become the focus of many patents since the BT resin patent published by Mitsubishi Gas Co., Ltd. on August, 1978. The patents on this area are so vast: U.S. Pat. No. 4,456,712, U.S. Pat. No. 4,683,276, U.S. Pat. No. 4,749,760, U.S. Pat. No. 4,847,154, U.S. Pat. No. 4,902,778, U.S. Pat. No. 4,927,932, U.S. Pat. No. 4,996,267, U.S. Pat. No. 6,534,179, U.S. Pat. No. 6,774,160, JP1197559, JP7070316, JP200129468, JP2006169317, JP2006022309 etc., too numerous to enumerate.

Further more, the epoxide resin/bismaleimide system, BT resin etc. are unable to form a stable solution in all kinds of low-boiling solvent. For easy to prepreg, it is required usually to use the high boiling-point intensive polarity solvent as dimethyl formamide (DMF) and N-methylpyrrolidone etc. to help dissolution. And application of DMF and N-methylpyrrolidone solvents etc. will speed up the reactivity of resin system and severely affect the gelation time of resin composition, bring some problems along topping with gum.

In the case of using 4-(maleimide phenyl) glycidol ether (MPGE) epoxide resin directly with DICY or phenol formaldehyde resin as curing agent, applied to manufacturing of copper clad panel, the glass transition temperature can only reach about 170° C. In order to increase the glass transition temperature further, it is nesessary to take modification to bismaleimide. If just simple blending, the phase separation would be brought since poor consistency between the both, that is not suit prepreg process. Therefore it is required to take a prepolymerization process for it.

The present invention aims to develop a prepolymer, which is applied to manufacturing high performance thermosetting resin composition, and to apply the prepolymer to manufacturing high performance thermosetting resin composition corresponding to the package requirements of electronic components and integrated circuit (IC), to reduce its price, and not to use high boiling-point polar solvent as DMF and N-methylpyrrolidone etc., but to be able to dissolve in the common low boiling-point non-polar solvents such as acetone, toluene, dichloromethane, butanone or methyl isobutyl ketone to form a stable solution.

SUMMARY OF THE INVENTION

The purpose of the present invention is providing a new thermosetting resin composition with low price. The resin composition forms stable homogeneous phase solution in the low boiling-point solvents. The copper clad panel material made from it has high glass transition temperature (Tg), excellent dielectric property, low thermal expansion coefficient, low water absorption rate, high heat shock resistance and excellent thermal conductivity etc. It is qualified for the substrate material applied to packaging electronic component and integrated circuit (IC).

A thermosetting resin composition provided by the present invention contains the following components: (1) epoxide resin, which exists at least in one sort of molecular structure and is able to copolymerize with bismaleimide, accounting for 1.75%-18.0% the weight of solids in the composition; (2) at least one sort of bismaleimide compound, accounting for 0.15%-12.5% the weight of solids in the composition; (3) the free-radical initiator, its volume of addition accounts for 0.01%-0.15% mole fraction for the total amount of reactive monomers: epoxide resin and bismaleimide compound; (4) the inhibitor, its usage is a half of to double amount of initiator by mole; (5) at least one sort of styrene-maleic anhydride low polymer with the molecular weight range of 1400-50000, accounting for 17.5%-47.0% the weight of solids in the composition; (6) at least one sort of filling, accounting for 20%-60% the weight of solids in the composition; (7) at least one sort of solvent, its volume of addition accounts for 20%-50% the weight of solids in the composition; (8) at least one sort of flame retardant, which is able to be used in copper-clad panel industry.

The epoxide resin stated accounts for 2.2%-14.5% the weight of solids in the composition.

The structure of the epoxide resin stated is:

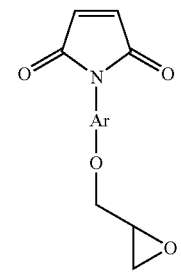

Ar:

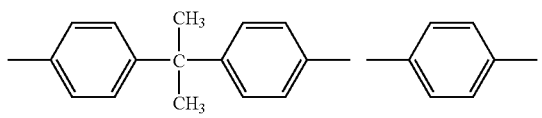

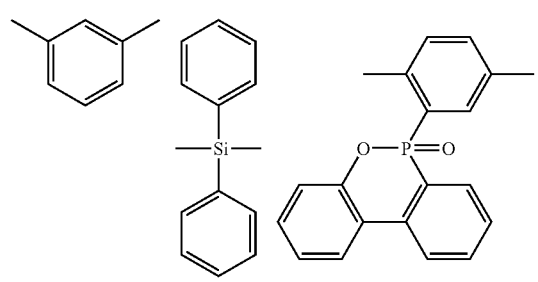

The bismaleimide compound stated accounts for 1%-10.5% the weight of solids in the composition.

The structure of the bismaleimide stated is:

R:

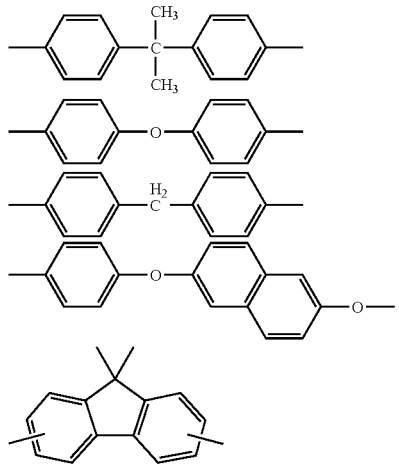

The initiator stated is a mixture of one or more sorts among azo compounds or peroxides.

The addition volume of the initiator stated accounts for 0.05%-0.10% mole fraction of the total amount of reactive monomers: epoxide resin and bismaleimide compounds.

The inhibitor stated is one or more sorts among quinones, aromatic nitrocompounds, variable valence metallic salts, phenols or amides.

The range of molecular weight of styrene-maleic anhydride low polymer stated is 1400-50000.

The styrene-maleic anhydride low polymer stated accounts for 22.5%-38.0% the weight of solids in the composition.

The filling is a mixture of one and more sorts among silica (including crystal, melting, and spherical silica), alumina, mica, talc powder, boron nitride, aluminium nitride, carbolon, diamond, calcined clay, aluminium oxide, aluminium nitride fiber and glass fiber.

The filling stated accounts for 30%-50% the weight of solids in the composition.

The solvent contains one or more sorts among acetone, methylethylketone (butanone, MEK), methylisobutylketone, cyclohexanone, toluene and methylene chloride.

The flame retardant is bisphenol A bromide epoxy resin, accounting for 5.00%-32.5% the weight of solids in the composition.

The theory to select all components is:

(1) Epoxide Resin

To add epoxide resin into the resin composition is in order to gain the basic mechanical and thermal performance required for the cured resin and the substrate made from it.

The maleimide can improve the high temperature resistance of epoxide resin. The three ways for modification are: reactive crosslinking with polybismaleimide and epoxide resin to form interpenetrating networks (IPN) structure; curing epoxide resin by curing agent containing imide group; blending thermoplastic polyimide or polyimide functional group and epoxide resin. The main weaknesses of these methods are poor compatibility of imide component with epoxide resin, more difficult processing and shaping. On the other hand, the work to induce the imide group onto the epoxide resin main chain is hot field to be studied now. Usually, the thermal stability and fire-retardancy of epoxide resin are improved by means of adding polyimide or imide compounds into epoxide basal body or using it as a curing agent.

By means of simple addition reaction of maleimide containing hydroxyl group and epoxy group as well using triphenylphosphine and methylethylketone as catalyst and solvent, the interpenetrating networks structure is first obtained by Chuan-Shao Wu et al. The glass transition temperature of the epoxy condensate modified by maleimide increases from 369° C. to ~386° C. In $N_2$ atmosphere, the carbon residue rate at 800° C. is up to 27.3%, the LOI value reaches 29.5. The 4-(N-maleimide phenyl)glycidyl ether (MPGE) epoxide synthesized by Ying-Ling Liu et al is cured by DDM and DICY and DEP (diethyl phosphite) separately to get cross linking network. In $N_2$ atmosphere, the temperature of 5% lost of weight can reach 355° C., the integrated product decomposition temperature (IPDT) reaches 2287° C., carbon residue rate at 800° C. reaches 60.38%; In air, the temperature of 5% lost of weight reaches 348° C., the full decomposition temperature reaches 669° C., carbon residue rate at 800° C. reaches 11.01%, the LOI value is up to 48.0.

(2) Bismaleimide (BMI)

The bismaleimide compound used in the resin composition of the present invention could be their prepolymer, solely or in conjunction with amines compound. The bismaleimide used in the invention is any organic matter which contains two maleimide groups in its structure. The organic matter is reaction product of maleic anhydride and a sort of diamine such as aromatic or aliphatic diamine. This kind of compound can polymerize by heating or adding catalyst. U.S. Pat. Nos. 3,562,223, 4,211,860 and 4,211,861 revealed all applicable bismaleimides. Common monomer of bismaleimide is so-called diamine diphenylmethane bismaleimide. This bismaleimide monomer can be obtained with cheaper price from market.

4,4'-diamine diphenylmethane bismaleimide is a main sort of addition polyimide. It is synthesized by heating or adding catalyst from 4,4'-aminobenzene diphenylmethane and diamine. The bismaleimide belongs to thermosetting resin. After its thermal polymerization, the polymer with high crosslinking degree is formed. It has favorable thermal resistance, flame resistance and insulativity, and moderate price. Therefore, BMI is be thought to a more ideal resin matrix for manufacturing heat resistance structure material and insulation material at present, and a multiuse organic matter with difunctional group. The high electrophilicity of its double bond makes it react with many nucleophilic reagents easily. And its specific thermal resistance is determined by its pentaatomic heterocycle structure.

(3) Free-Radical Initiator

In order to resolve the problem about the solubility of bismaleimide/epoxide resin system, it is required to prepolymerize the bismaleimide/epoxide resin system for certain time under certain temperature. The resulted prepolymer can be dissolved by conventional low boiling-point solvents such as acetone, butanone etc. to form a stable homogeneous phase solution.

Three competing reactions take place by initiator and heating in the mixture of BMI and epoxide resin: their respective homopolymerizations and copolymerization between BMI and epoxide resin. Thus, ratio of reagents, kind and usage of initiator, kind and usage of solvent, reaction temperature, reaction time etc. are key factors influencing reaction.

The ratio of reagents: to take N-phenyl maleimide epoxide resin for an example, the appropriate mole ratio for bismaleimide to N-phenyl maleimide epoxide resin can be from 0.05 to 0.5, the favorable mole ratio is 0.25-0.475.

The kind and usage of initiator: the applicable kind of initiator should be selected as required, to get moderate free radical forming rate and polymerization rate. If the decomposition activation energy of initiator too high or the half-life of it over length, then the decomposition rate is too low, so that the polymerization time will prolong; But if the activation energy too low, the half-life too short, then the imitation reaction is too fast to control the temperature. It is possible to lead flash polymerization. The polymerization time will prolong, or the initiator will decompose over too early, so the polymerization is stopped at very low conversion rate. Thus should be selected such initiator, which half-life is the same order of magnitude as the polymerization time or equivalent. The complex initiator is selected usually, so that the reaction could carry out at more even speed. The common initiator is of azo compounds (such as azo-bis-isobutyronitrile) and peroxides (such as dicumyl peroxide). The usage of initiator will influence reaction rate and molecular weight. The usage of initiator too low, the conversion rate of monomers low; the usage too more, then free radical's rate of growth increases, which will cause the instant free radical excess concentration, resulting in aggregation. The appropriate amount of initiator is 0.01%-0.15% (mole fraction) of total monomer amount. When the amount of initiator is 0.05%-0.10%, the prepared prepolymer can dissolve in the common solvent such as acetone, butanone etc. to form a stable homogeneous phase solution.

The kind and usage of solvent: when the good solvent is selected, the homogeneous polymerization takes place. If the usage of solvent is proper, then the monomer concentration is not high, and it is possible to eliminate the autoacceleration effect. But when the precipitating agent or the poor solvent is selected, the autoacceleration is noticeable, and it is difficult to control the reaction. Usually, acetone, toluene, dichloromethane, butanone, cyclohexanone or methylisobutyl ketone is selected as a solvent. To account for 50%-75% total weight of all the prepolymerization mixture (including epoxide resin, bismaleimide, and/or free-radical initiator) is suitable for the usage of solvent. The recommended amount of solvent is 60%-70%.

The reaction conditions: namely the reaction temperature and the reaction time controlling. If the reaction temperature is low, the required reaction time is long; and the reaction temperature is high, the reaction time could be less. If the reaction temperature is too high, the reaction is too intense, leading to flash polymerization. If the initiator of azo compound such as azo-bis-isobutyronitrile is selected, it is suitable to control reaction temperature at 60-90° C., and the reaction time in 10-60 min. If the initiator of peroxide is selected, then the reaction temperature should be raised to 100-130° C.

(4) Inhibitor

After the bismaleimide/epoxide resin system is prepolymerized under certain temperature, in order to ensure the stability of prepolymer during storage, it is necessary to add the required amount of inhibitor into it. Since the same inhibitor has a different inhibitive effect to different monomer, so the suitable inhibitor shall be selected according to the kind of monomer to be used. The general selecting criteria is as following: 1) For the monomer with electron donating substituting group, such as styrene, vinyl acetate etc., the proelectron substance such as quinones, aromatic nitro-compounds or variable valence metallic salts can be selected as inhibitor. 2) For the monomer with electron-attracting substituting group, such as acrylonilitrile, acrylic acid, methyl acrylate etc., the electron donating substance such as phenols, amines etc. can be selected as inhibitor. 3) In order to avoid the side reactions, it should be avoided that the inhibitor and the initiator build a oxidation-reduction system so the reaction speed increases.

In the present invention, the electrophilicity substance such as quinones, aromatic nitro-compounds or variable valence metallic salts and the electron donating substance such as phenols, amines etc. are selected as inhibitor. Usually, the usage of inhibitor by a half of to double the amount of initiator used (by mole) is appropriate.

(5) Styrene-Maleic Anhydride Low Polymer

The thermosetting resin composition stated in the present invention includes one or more sorts of styrene-maleic anhydride (SMA) low polymers. Thermal property and electrical property of cured polymer and its product can be improved by SMA further. The SMA available commercially has two kinds mainly. One kind is copolymer with high molecular weight (molecular weight over hundred thousand, even up to million level). This kind of SMA belongs to thermoplastic polymer in fact. It is not suitable for manufacturing prepregs. Furthermore as its anhydride content low (commonly at 5-15%), it is also not suitable to use as cross-linking agent of epoxide resin. Another kind of SMA, molecular weight 1400 to 50000, has anhydride content above 15%. The present invention plans to use this kind of SMA. The recommended molecular weight range of the SMA low polymers is 1400-10000. Such as SMA1000, SMA2000, SMA3000, SMA4000, they are available commercially, and the mole ratio for styrene to maleic anhydride in these low polymers is 1:1, 2:1, 3:1 and 4:1 respectively, whereas the range of molecular weight is from 1400 to 2000. One kind of above SMA copolymer or their mixture is applicable to be distributed to the resin composition stated in the present invention.

The usage of SMA in resin composition accounts for 17.5-47.0 parts by weight, as per the composition solids weight 100 parts. The recommended usage is 22.5-38.0 parts by weigh.

(6) Filling

Filling can improve chemical and electric property of the curing resin, such as to reduce coefficient of thermal expansion (CTE), to increase module, to speed up heat transfer etc. Silica (including crystal, melting and spherical silica), alumina, mica, talc powder, boron nitride, aluminum nitride, carbolon, diamond, calcined clay, aluminum oxide, aluminum nitride fiber and glass fiber etc. can be all used as addition material to polymer-based composition package material. The performance of composition material can be adjusted within certain range by selecting different sort or different pattern as granular, spherical or fibrous in-organics and adjusting its content, distribution as well as bonding with polymer interface. Therein, calcined clay or molten silica, or silica-processed silica or aluminum nitride or boron nitride or alumina can be considered as the first choice for the filling material to be used.

The filling used in the present invention accounts for 20-60% total weight of whole solid composition. The recommended ratio is 30%-50%.

(7) Solvent

In the present invention, besides the solvent to be required during prepolymerization, it is possible also to use one or more solvents to improve resin solubility, to control resin viscosity, to ensure that the contents of resin composition all present homogeneous state or suspend dispersed state. In principle, any solvent in connection with thermosetting resin can be used. Applicable solvents include acetone, methylethyl ketone.(butanone, MEK), methylisobutyl ketone, cyclohexanone, toluene, dichloromethane etc, or their mixture. Selection of solvent often depends on applied resin solidification system and resin curing mode. If the hot air curing mode used, then ketone solvent is used usually; and infrared curing mode used, then mixed toluene and ketone solvent is used usually. Solvent usage accounts for 20%-50% weight of the whole composition.

(8) Flame Retardant

One and more flame retardant can be added to the resin composition in the present invention. Any flame retardant applied in copper clad panel industry can be used in the present invention. The applicable flame retardants can include, but not limited to: glycidol ether type difunctional alcohol halide; bisphenol A, bisphenol F, polyvinylphenol or Novolac resin (of phenol, cresol, alkyl phenol etc.) halide; inorganic flame retardant material, such as antimony trioxide, red phosphorus, zirconium hydroxide, barium metaborate, aluminium hydroxide, magnesium hydroxide; phosphorus flame retardant, such as tetraphenyl phosphonium, tri-orthocresyl diphenyl phosphate, triethyl phosphate, cresyl diphenyl phosphate, acidic organic phosphate, nitrogenous phosphate (ester) and halogenous phosphate and so on.

Alternative kind of flame retardants is bromated compounds with following structure:

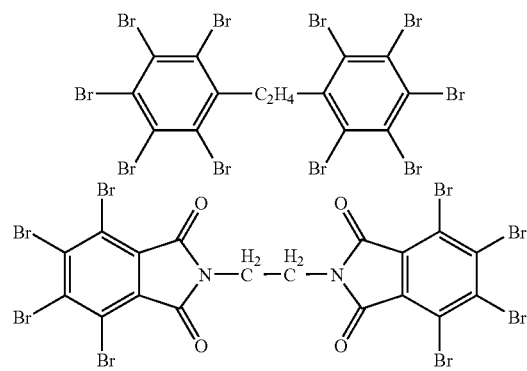

When use bromated compound or bromated epoxide resin or bromated Novolac resin as flame retardant, usage of flame retardant should make the bromine content account for 8%-30% total weight of solid resin, optimum bromine content is 10%-20%.

In the present invention, each component below can also be added, the theory is as follows:

(9) Promoter

One and more promoters can be added into resin composition, to cure resin and speed up resin curing. Selected promoter could be any known promoter, which can speed up thermosetting resin curing process. The applicable promoters is imidazoles, especially alkyl substituted imidazole, such as 2-methyl imidazole, 2-ethyl-4-methyl imidazole, 2-phenyl imidazole, 2-ethyl-4-phenyl imidazole etc. Other suitable promoters include various kinds of quaternary amine, such as benzyl dimethylamine, 4,4'- and 3,3'-diaminodiphenyl sulphone. The recommended promoter is 2-ethyl-4-methyl imidazole. The usage of promoter depends on following factors: the type of epoxy resin used, the type of hardener and the type of promoter etc. To use excess promoter could result in overtop reaction activity for resin system. Skilled technician can easily determine the usage of promoter, bring adequate activity to resin, to facilitate manufacturing of prepregs. Generally speaking usage of promoter is between 0.001% and 2% total weight for epoxide resin and hardener. In many cases this number range is 0.01%-0.05%. Resin gel time depends on the kind and usage of promoter, the kind and usage of solvent, the kind and usage of filling and the kind of prepreg to be manufactured (glass cloth kind).

(10) Plasticizer

The resin composition in the present invention can contain one or more plasticizers. The purpose of adding the plasticizer into resin composition is to improve hole drilling and thermal reliability of printed circuit board. The applicable plasticizers include methyl methacrylate/butadiene/styrene copolymer, styrene/butadiene copolymer, polymethyl methacrylate/butadiene/styrene core-shell particle, polydimethylsiloxane core-shell particle etc. and their mixture. The recommended plasticizer is MBS core-shell particle purchasable from Rohm & Hass. The usage of plasticizer accounts for 1%-5% weight of all complex solids. The recommended usage is 2%-4%.

(11) Miscellaneous Additives

The thermosetting resin composition in the present invention can further embrace miscellaneous additives like defoamer, flow ping agent, dyestuff, pigment etc.

In this context, the range of ratio for each components of the thermosetting resin composition in the present invention is shown in Table 1.

TABLE 1

The range of ratio for each components of thermosetting resin composition
IC package substrate resin composition formulation
(for each components, as solids 100%)

| Components | Range (Wt. %) | Recommended usage (Wt. %) |
|---|---|---|
| Epoxide resin | | |
| MPGE | 1.75-18.0 | 2.2-14.5 |
| Bismaleimide | | |
| 4,4'-diphenylmethane bismaleimide | 0.15-12.5 | 1.0-10.5 |
| Initiator | | |
| azo compounds or peroxides | * | * |
| Inhibitor | | |
| electrophilic substance or Styrene-maleimide copolymer | * | * |
| SMA | 17.5-47.0 | 22.5-38.0 |
| Plasticizer | | |
| MBS Core-shell particle | 1-5 | 2-4 |
| Flame retardant | | |
| bromobisphenol A epoxide resin | 5.00-32.5 | 6.4-28.5 |
| Promoter | | |
| imidazoles | 0.001-2 | 0.001-0.05 |
| Filling | | |
| filling | 20-60 | 30-50 |

Note:
Initiator usage is 0.01%-0.15% of mole sum of reaction monomers; and inhibitor usage is half to double of molar quantity of initiator to be used.

In formula, firstly, the mixture of MPGE and BMI is dissolved with the solvent (the amount of the solvent used accounts for 50-70% of the weight of the entire mixture in reaction), and reacted for 10-60 min via the initiator under certain temperature (60-130° C.), and then the inhibitor is added, and stirred for 10-15 min while it is hot, and then cool. The prepolymer obtained is added with the SMA, flame retardant, plasticizer and the promoter pre-dissolved by the solvents such as the butanone, slowly adding fillers and other additives after full stirring, and then supplemented with appropriate amount of solvent so that the solids of the final resin composition occupies 45-70%, and the advised amount of solvent is so as to adjust the solids of the composition in the range of 50-65%. The thermosetting composition in this invention is formed after fully mixed.

The invented thermosetting composition is used to manufacture Prepreg in a continuous process. Usually glass fiber canvas is used as substrate. The scrolled glass fiber canvas continuously goes through a series of rollers to enter in the plastic planter trough in which the thermosetting composition in this invention is loaded. The glass fiber canvas is fully infiltrated by resin in the plastic slot, and then the redundant resin is cut and removed through the measuring roller, enters the plastic furnace baking certain period of time so that the solvent evaporates and resin cures to certain extent, cooling, rolling, and forming a Prepreg.

A certain number of e-7628 glass fiber canvas are impregnated through the above-mentioned resin to form the Prepreg, which are stacked aligning with a 1 oz electrolytic copper foil at both top and bottom respectively, which in turn are made into the double-sided CCL with certain thickness by process of increasing the temperature from 80° C. to 200° C. within 30 min under the pressure of 40-900 psi in vacuum compressor, and then pressing 120 min at 200° C., and cooled to room temperature within 30 min. In general, 1.0 mm thickness needs five pieces of 7628 Prepreg, 1.6 mm needs eight pieces of 7628 Prepreg, and 2.0 mm needs ten pieces of 7628 Prepreg.

The thermosetting resin composition provided in this invention forms a stable homogeneous solution in the low boiling point solvents of which the CCL is created, and analyzed for, reference to IPC-TM-650, indicators such as glass transition temperature, thermal decomposition temperature, thermal stratification timing, solder thermal resistance (288° C.), coefficient of thermal expansion, water absorption rate, thermal conductivity rate, dielectric constant and dielectric loss factor, and combustion resistance, by which the results show that: it has the characteristics such as high glass transition temperature (Tg) and excellent dielectric properties, low thermal expansion coefficient, low water absorption rate, high resistance to heat impact and high heat conductivity rate, suitable to be used as substrate materials for electronic components and integrated circuits (IC) packaging.

DETAILED DESCRIPTION OF THE PREFERRED EMBODIMENTS

The following implementation cases are detailed description of the present invention, but they do not define the boundary and the scope of the present invention.

Implementation case 1, MPGE/BMI prepolymers (hereinafter referred to prepolymers I) Preparation (see Table 2):

21.9 grams (0.0886 equiv.) of MPGE, 31.7 grams of 4,4'-two-diphenylmethane-bismaleimide (0.0885 equiv.), and 104.0 grams of ketone (solvents) are put into a three-entrances round-bottom flask equipped with recurrent condenser, blender and thermometer, with the temperature increased to 80° C. by stirring in N2 atmosphere, then 0.073 grams of azo-iso-cyanide (free radical initiator) is slowly added twice with half each, refluxing for 20 min, and then 0.048 grams of hydroquinone (inhibitor) is added, and cooled to the room temperature. The obtained is the prepolymer I solution with 34.0% of solid content.

Implementation case 2, MPGE/BMI prepolymers (hereinafter referred to prepolymers II) Preparation (see Table 2):

The reactions and methods are the same as the implementation case 1, with only exception that the amounts of reaction substances become respectively: MPGE 43.8 grams (0.177 equiv.), 31.8 gram of 4,4'-two-diphenylmethane-bismaleimide (0.0885 equiv.), 147.1 grams of butanone, 0.108 grams of azo-iso-cyanide, 0.070 grams of hydroquinone. The obtained is the prepolymer II solution with 34.0% of solid content.

TABLE 2

MPGE/BMI prepolymers Preparation

| Components | Content (g) Prepolymer I | Content (g) Prepolymer II |
|---|---|---|
| Epoxy | | |
| MPGE | 21.9 | 43.8 |
| Bismaleimide | | |
| 4,4'-two-diphenylmethane-bismaleimide | 31.7 | 31.8 |
| Initiator | | |
| Azo-iso-cyanide | 0.073 | 0.108 |
| Inhibitor | | |
| Hydroquinone | 0.048 | 0.070 |
| Solvent | | |
| Butanone | 104.0 | 147 |

Prepolymer I Synthesis Reaction Equation:

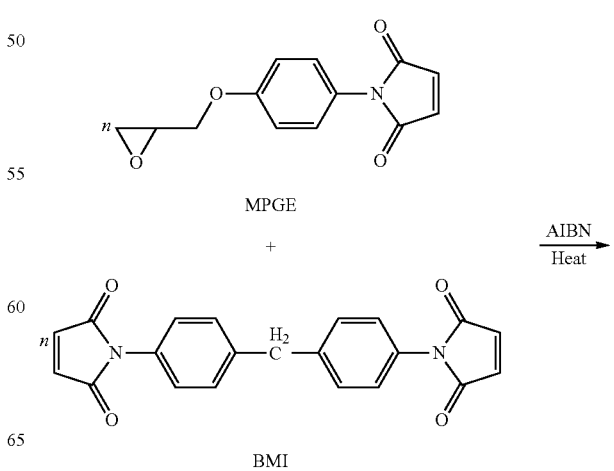

MPGE

+

BMI $\xrightarrow{\text{AIBN}}{\text{Heat}}$

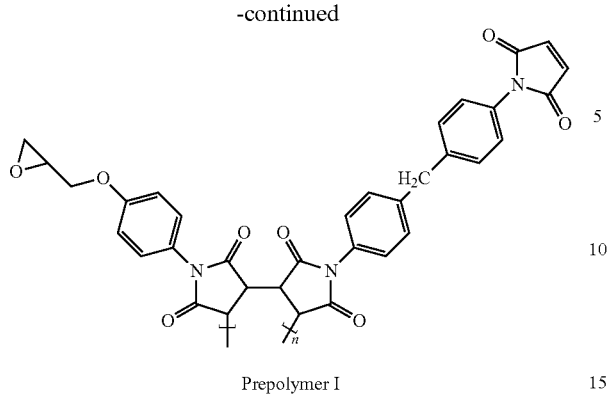
Prepolymer I
Product of the Copolymer in Prepolymer I
Prepolymer II Synthesis Reaction Equation:
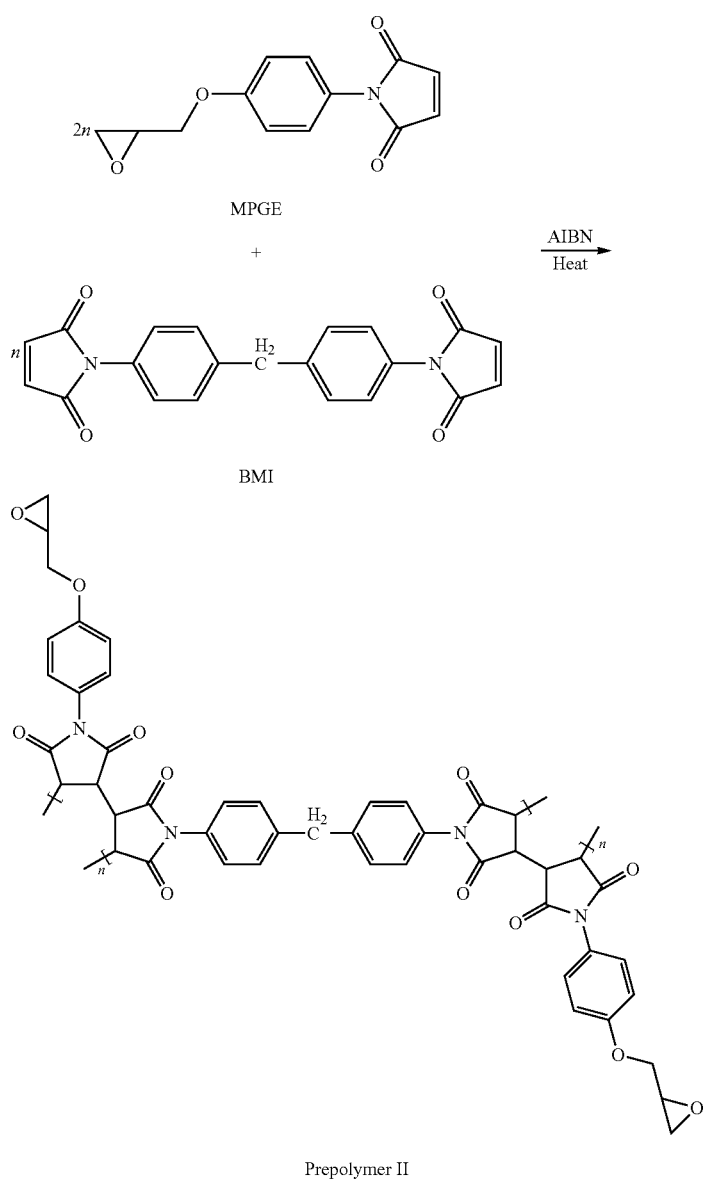

The Copolymer Product in Prepolymer II

The implementation cases 3-14 and the comparison cases 1-3 for thermosetting resin composite:

For the Formula of the Implementation Cases, See Attachment 3 and Attachment

TABLE 3

Resin composite formula for implementation cases 3-10

| Components | Content (g) Implementation Cases ||||||||
|---|---|---|---|---|---|---|---|---|
|  | 3 | 4 | 5 | 6 | 7 | 8 | 9 | 10 |
| Prepolymer |  |  |  |  |  |  |  |  |
| prepolymer I (100.0%) | 70.1 | 39.6 | 70.1 | 39.6 | 70.1 | 39.6 | 70.1 | 39.6 |
| Flame Retardant |  |  |  |  |  |  |  |  |
| Brominated epoxy bisphenol A (100%) | 29.8 | 16.8 | 29.8 | 16.8 | 29.8 | 16.8 | 29.8 | 16.8 |
| Styrene-maleimide copolymer |  |  |  |  |  |  |  |  |
| SMA3000 | 103.6 | 58.5 | 103.6 | 58.5 | 103.6 | 58.5 | 103.6 | 58.5 |
| Plasticizer |  |  |  |  |  |  |  |  |
| MBS core-shell particles (100%) | 3.0 | 3.0 | 3.0 | 3.0 | 3.0 | 3.0 | 3.0 | 3.0 |
| Promoter |  |  |  |  |  |  |  |  |
| 2-ethyl-4-imidazole | 0.006 | 0.006 | 0.006 | 0.006 | 0.006 | 0.006 | 0.006 | 0.006 |
| Filling |  |  |  |  |  |  |  |  |
| AIN | 88.5 | 177.0 |  |  |  |  |  |  |
| Melted Silica |  |  | 88.5 | 177.0 |  |  |  |  |
| Alumina |  |  |  |  | 88.5 | 177.0 |  |  |
| Calcined Bolus Alba |  |  |  |  |  |  | 88.5 | 177.0 |
| Solvent |  |  |  |  |  |  |  |  |
| Butanone | 205.0 | 205.0 | 205.0 | 205.0 | 205.0 | 205.0 | 205.0 | 205.0 |

TABLE 4

Resin composition formula for implementation cases 11-14 and comparison cases 1-3

| Components | Content (g) |||||||
|---|---|---|---|---|---|---|---|
|  | Implementation Cases |||| Comparison Cases |||
|  | 11 | 12 | 13 | 14 | 1 | 2 | 3 |
| Prepolymer |  |  |  |  |  |  |  |
| MPGE (100.0%) |  |  |  |  | 46.3 | 32.9 |  |
| Prepolymer I (100.0%) |  |  | 48.5 | 34.4 |  |  | 96.6 |
| Prepolymer II (100.0%) | 59.9 | 42.5 |  |  |  |  |  |
| Flame Retardant |  |  |  |  |  |  |  |
| Brominated epoxy bisphenol A (100%) | 32.0 | 22.7 | 51.4 | 36.5 | 35.1 | 24.9 | 41.0 |
| Styrene-maleimide copolymer |  |  |  |  |  |  |  |
| SMA3000 | 111.6 | 79.3 | 103.7 | 73.7 | 122.2 | 86.7 | 142.7 |
| Toughener |  |  |  |  |  |  |  |
| MBS core-shell particles (100%) | 3.0 | 3.0 | 3.0 | 3.0 | 3.0 | 3.0 | 3.0 |
| Promotor |  |  |  |  |  |  |  |
| 2-ethyl-4-imidazole | 0.004 | 0.004 | 0.004 | 0.004 | 0.004 | 0.004 | 0.004 |
| Filler |  |  |  |  |  |  |  |
| Spherical silica (SS0030) | 88.5 | 147.5 | 88.5 | 147.5 | 88.5 | 147.5 | 0.0 |
| Solvent |  |  |  |  |  |  |  |
| Butanone | 205.0 | 205.0 | 205.1 | 205.0 | 205.0 | 205.0 | 217.0 |

In formula of Prepolymer I and Prepolymer II, the molar ratio of BMI and MPGE (hereinafter referred to MR) is 1:1 and 1:2, respectively; in implementation cases 3-10, the filler ratio is 30% or 60% (mainly for the purpose of inspecting the impact of the different filler and its content on the properties of substrates); in formula of implementation cases 11 and 12, the filler ratio is 30% and 50% respectively; in formula of implementation cases 13 and 14, the filler ratio is 30% and 50% respectively, but the content of bromine in system has been increased to 13.5% (excluding the weight of fillers and BMI) (Note: the content of bromine in formula of implementation cases 3-12 is 8.0%); in comparison cases 1 and 2, BMI is not added, and the ratio of filler is 30% and 50% respectively; in formula of comparison case 3, MR is 1:1, and the filler is not added.

Take the implementation case 3 as an example for illustration. In the container with the high-speed mixing device, 70.1 grams of prepolymers I is poured in, adding 205.0 grams of butanone and 29.8 grams of bisphenol A epoxy resin (60% butanone solution and epoxy equivalent to 400), stirring, orderly adding 103.6 grams of SMA3000 (a small pieces at a time), 3.0 grams of MBS core-shell particles, and 0.006 grams of 2-ethyl-4-imidazole (adding after diluted with MEK), then slowly adding 88.5 grams of nitride aluminum. Mixing for more than one hour, and then staying untouched.

For simplicity, the preparation of Prepreg takes a manual impregnation. 7628 glass fibre canvas is immersed into the resin solution, gluing gum, baking for 3-5 min at 155° C., forming the semi-curing adhesive film.

A certain number of 7628(or 106) glass fiber canvases are impregnated through the above-mentioned resin-forming Prepreg, which are stacked aligning with a 1 oz electrolytic copper foil at both top and bottom respectively, which in turn are made into the double-sided CCL with certain thickness by process of increasing the temperature from 80° C. to 200° C. within 30 min under the pressure of 40-900 psi in vacuum compressor, and then pressing 120 min at 200° C., and cooled to room temperature within 30 min. In general, 1.0 mm thickness needs five pieces of 7628 Prepreg (or 20 pieces of 106 Prepreg, 1.6 mm needs eight pieces of 7628 Prepreg.

The substrates made of 7628 glass canvas are used for property testing (such as the vitrification transition temperature, peeling strength, CTE, heat resistance, water absorption rate, fire-retardant characteristics, dielectric properties, etc.), and the substrates made of 106 glass canvas are used for thermal conductivity test.

Refer to IPC-TM-650 for testing CCL. Test results are shown in Table 5 and 6, summarized as below.

TABLE 5

| | Substrate characteristics of implementation cases 3-10 | | | | | | | |
|---|---|---|---|---|---|---|---|---|
| | Implementation Cases | | | | | | | |
| | 3 | 4 | 5 | 6 | 7 | 8 | 9 | 10 |
| Vitrification transition temperature (DSC), ° C. | 3 | 4 | 5 | 6 | 7 | 8 | 9 | 10 |
| Vitrification transition temperature (TMA), ° C. | 215.3 | 214.5 | 216.1 | 215.7 | 215.7 | 215.2 | 217.6 | 216.4 |
| Copper foil peeling strength (1 oz), lb/in | 200.2 | 199.7 | 200.8 | 200.1 | 200.8 | 200.3 | 201.7 | 200.8 |
| Z-axis CTE (before Tg) (TMA), ppm/° C. | 8.1 | 7.1 | 8.2 | 7.3 | 8.3 | 7.4 | 7.9 | 7.0 |
| Z-axis CTE (after Tg) (TMA), ppm/° C. | 34.7 | 26.7 | 31.1 | 23.1 | 25.6 | 20.5 | 30.4 | 21.3 |
| Z-axis CTE (50-260° C.) (TMA), % | 188.0 | 157.1 | 169.9 | 124.5 | 165.7 | 129.8 | 181.9 | 130.6 |
| X-axis CTE (TMA), ppm/° C. | 2.28 | 1.76 | 2.09 | 1.52 | 2.01 | 1.27 | 2.19 | 1.63 |
| Y-axis CTE (TMA), ppm/° C. | 11.9 | 11.3 | 11.4 | 11.0 | 11.2 | 10.8 | 11.7 | 11.0 |
| T288 (TMA), min | 12.2 | 11.6 | 11.7 | 11.3 | 11.5 | 11.0 | 12.0 | 11.4 |
| T300 (TMA), min | >60 | >60 | >60 | >60 | >60 | >60 | >60 | >60 |
| Td (5% weight loss), ° C. | 15.6 | 11.5 | 41.5 | 40.6 | 40.5 | 40.7 | 51.3 | 49.2 |
| Water absorption (D-23/24), wt % | 358.9 | 358.8 | 365.1 | 363.6 | 363.7 | 363.8 | 367.6 | 365.7 |
| Water absorption (PCT * 5 hr), wt % | 0.006 | 0.005 | 0.006 | 0.005 | 0.006 | 0.005 | 0.007 | 0.006 |
| Solder heat resistance (PCT * 5 hr + 288° C. solder dip) | 0.140 | 0.134 | 0.136 | 0.131 | 0.140 | 0.133 | 0.145 | 0.139 |
| X/Y-axis thermal conductivity, W/m · k | >10 min | >10 min | >10 min | >10 min | >10 min | >10 min | >10 min | >10 min |
| Z-axis thermal conductivity, W/m · k | 2.53 | 3.24 | 1.11 | 1.45 | 1.78 | 2.34 | 1.24 | 1.57 |
| Dielectric constant (1 G/Hz) | 1.39 | 1.83 | 0.58 | 0.76 | 0.92 | 1.23 | 0.68 | 0.84 |
| Dielectric loss factor (1 G/Hz) | 3.83 | 3.87 | 3.76 | 3.81 | 3.85 | 3.90 | 3.84 | 3.88 |
| Flame retardant (UL-94, rating) | 0.007 | 0.006 | 0.007 | 0.006 | 0.007 | 0.006 | 0.007 | 0.006 |

TABLE 6

Substrate Characteristics of Implementation Cases 11-14 and Comparison Cases 1-3

|  | Implementation Cases | | | | Comparison Cases | | |
| --- | --- | --- | --- | --- | --- | --- | --- |
|  | 11 | 12 | 13 | 14 | 1 | 2 | 3 |
| Vitrification transition temperature (DSC), °C. | 205.6 | 205.8 | 201.7 | 200.9 | 173.1 | 172.5 | 207.7 |
| Vitrification transition temperature (TMA), °C. | 191.2 | 190.6 | 188.2 | 187.6 | 159.6 | 158.4 | 192.5 |
| Copper foil peeling strength (1 oz), lb/in | 8.2 | 7.4 | 8.3 | 7.5 | 7.9 | 7.0 | 8.6 |
| Z-axis CTE (before Tg) (TMA), ppm/° C. | 32.3 | 25.1 | 32.1 | 24.7 | 41.1 | 33.9 | 50.2 |
| Z-axis CTE (after Tg) (TMA), ppm/° C. | 172.9 | 126.5 | 171.3 | 125.5 | 210.7 | 182.5 | 276.8 |
| Z-axis CTE (50-260° C.) (TMA), % | 2.19 | 1.82 | 2.15 | 1.63 | 2.87 | 2.53 | 3.15 |
| X-axis CTE (TMA), ppm/° C. | 11.4 | 11.1 | 11.4 | 11.0 | 12.8 | 12.2 | 14.4 |
| Y-axis CTE (TMA), ppm/° C. | 11.7 | 11.5 | 11.7 | 11.4 | 13.5 | 12.6 | 15.4 |
| T288 (TMA), min | >60 | >60 | >60 | >60 | >60 | >60 | >60 |
| T300 (TMA), min | 40.5 | 39.7 | 40.3 | 38.6 | 36.5 | 34.6 | 42.4 |
| Td (5% weight loss), °C. | 363.1 | 363.3 | 363.3 | 359.6 | 362.1 | 361.6 | 363.8 |
| Water absorption (D-23/24), wt % | 0.007 | 0.006 | 0.007 | 0.006 | 0.009 | 0.008 | 0.010 |
| Water absorption (PCT * 5 hr), wt % | 0.146 | 0.143 | 0.147 | 0.142 | 0.185 | 0.181 | 0.245 |
| Solder heat resistance (PCT * 5 hr + 288° C. solder dip) | >10 min | >10 min | >10 min | >10 min | >10 min | >10 min | >10 min |
| X/Y-axis thermal conductivity, W/m · k | 1.13 | 1.38 | 1.12 | 1.39 | 1.08 | 1.27 | 0.47 |
| Z-axis thermal conductivity, W/m · k | 0.59 | 0.70 | 0.58 | 0.71 | 0.54 | 0.64 | 0.34 |
| Dielectric constant (1 G/Hz) | 3.75 | 3.82 | 3.76 | 3.83 | 3.92 | 3.93 | 3.70 |
| Dielectric loss factor (1 G/Hz) | 0.007 | 0.006 | 0.007 | 0.006 | 0.008 | 0.007 | 0.010 |
| Flame retardant (UL-94, rating) | V-0 | V-0 | V-0 | V-0 | V-0 | V-0 | V-0 |

All of the following detection methods are commonly used in this area, and therefore, their specific steps will not be described.

1) Vitrification Transition Temperature (Tg)

Vitrification transition temperature is the corresponding temperature (° C.) in which the plate transforms from the glass state to high-elastic state (rubbery state) under the circumstance of heating.

Detection Methods Differential scanning calorimetry (DSC) and thermo-mechanical analysis (TMA).

The results showed that the sheet/plate has rather high vitrification transition temperature (Tg), reaching 200° C. and up (DSC).

2) Thermal Decomposition Temperature (Td)

Thermal decomposition temperature (Td) refers to the thermal decomposition reaction temperature (° C.) under which the sheet is reacting to heat.

Detection Method: The thermal gravimetric analysis (TGA). Conditions are: heating rate of 10° C./min, heating weight loss of 5 percent.

The results showed that the plate has rather high thermal decomposition temperature, Td reaching 355° C. and up.

3) Thermal Stratification Time (T-300)

T-300 thermal stratification refers to the duration before the sheet occurs thermal stratification due to heating at 300° C. temperature setting.

Detection Method: thermo-mechanical analysis (TMA).

The results show that: the sheet has a rather high thermal stratification temperature and thermal stratification time of which T-300 for all cases reach 40 min and above, with the exception the Implementation Cases 3 and 4 which are lower (but still 15.6 min and 11.5 min respectively).

4) Solder Heat Resistance

Solder heat resistance refers to the duration in which the sheet does not produce stratification and forming when immersed in the molten solder of 288° C. temperature.

Detection Method: the substrate is etched and cut into pieces with 5.0 mm×5.0 mm in size, with its edge ground by first 600 order and then 1200 order sandpaper, boiling in autoclave for a period of time, and put into the melting furnace of 288° C. temperature for 10 min, watch out whether the stratification or forming phenomena occurs.

The results showed that the plate has excellent solder heat resistance, with all of the duration more than 10 min under the 288° C. temperature.

5) Coefficient of Thermal Expansion (CTE)

Coefficient of thermal expansion (CTE) refers to the change in size which the sheet has per unit temperature under the condition of heating.

CTE of the sheet greatly related to temperature, especially the CTE in the direction of the thickness, which is very different for the temperature above Tg and below Tg.

The packaging requirement for the substrate materials with regard to coefficient of thermal expansion is that the sheet should have the corresponding CTE with Si, ensuring the chip packaging compatibility with Si.

Detection Method: thermo-mechanical analysis (TMA).

The results showed that, the sheet in heating has very good dimensional stability and very low CTE, with X/Y-axis CTE <12 ppm/, and Z-axis CTE <13 ppm/° C.

6) Water Absorption Rate

Water absorption rate refers to the ratio of the amount of water the sheet absorbed under circumstances such as boiling a certain period of time in autoclave, to the dry sample amount.

Detection Method: the substrate is etched and cut into pieces with 5.0 mm×5.0 mm size, with its edge ground by first 600 order and then 1200 order sandpaper, baking for 2 hours at 105° C. temperature, and then boiling in autoclave for a period of time.

The results show that the sheet, after 5 hrs in PCT, has rather low water absorption, all below 0.16 percent.

7) Thermal Conductivity Rate

Thermal conductivity rate refers to the direct heat conduction capacity for sheets, or thermal conduction rate. Its characterization is the direct conducting heat for the sheet with unit section and length, in unit temperature difference and unit time interval. Higher thermal conductivity can prevent multi-layer substrates overheating.

Detection Method: laser scattering method, according to ASTM E-1461 standard.

The results show that: the plate has rather high thermal conductivity, ensuring 1.0 W/m·k along X/Y axis and 0.55 W/m·k along the Z axis. This demonstrates good heat conduction property.

8) Dielectric Constant and Dielectric Loss Factor

The dielectric properties of Electronic Packaging Material is an important factor affecting computing speed of integrated circuits, with too high dielectric constant leading to increased transmission delay for the signals of integrated circuits, and high dielectric loss factor leading to serious signal distortion during its transmission. Therefore, the dielectric constant and dielectric loss factor are two important indicators characterizing of the high-frequency characteristics of the material.

Detection Method: the substrate is etched and cut into pieces with 5.0 mm×5.0 mm size, with its edge ground by first 600 order and then 1200 order sandpaper, baking for 2 hours at 105° C. temperature, and then measured with high-impedance meter.

The results showed that the sheet has both a low dielectric constant and a low dielectric loss factor, with dielectric constant of 3.7~3.9 under 1 GHz, and dielectric loss angle factor of 0.006-0.007.

9) Flammability

The sheet is etched to remove surface copper, with test sample preparation and testing in accordance with UL94 laminate combustion experiment.

The results show that: the flammability of the sheets can all reach UL94V-0 level.

From comparing the implementation cases 3-14 and comparison cases 1-2, it can be seen that, the CCL made from thermosetting resin composite provided in present invention, has the higher Tg and heat resistance, lower water absorption and CTE, as well as better dielectric properties and thermal conduction properties, comparing to the CCL made of simple MPGE. On the other hand, the resin composition in Comparison Case 3 does not add filler, with much higher CTE and water absorption than the resin composition with filler added, and with much poorer thermal conductivity relatively, which demonstrates that the present invention provides a CCL made of composition of thermosetting resin with excellent substrate properties.

The present invention provides a thermosetting resin composition which:

1, Compared with the existing epoxy resin, has low water absorption rate and has ameliorated the shortcomings that the epoxy resin is sensitive to water when exposed in high temperature and high humidity conditions;

2, Compared with the existing cyanate ester resin, has a lower price and lower water absorption, ameliorating the shortcomings of high brittleness after curing;

3, Compared with the existing Bismaleimide, can be soluble in the general organic solvents, easy processing, and high resistance to heat impact;

4, Compared with the existing BT resin, has a lower cost, convenient processing, and forms a stable solution in a variety of low-boiling point solvents, ameliorating the shortcomings of high brittleness after curing.

In summary, the CCL material made of thermosetting resin composition provided in the present invention has characteristics such as high vitrification transition temperature (Tg) and excellent dielectric properties, low coefficient of expansion, low water absorption rate, high resistance to heat impact and excellent impact heat conduction properties, etc., which complies to the requirements of the IC packaging, and facilitates the broad adoption of the substrate materials for IC packaging.

We claim:

1. A thermosetting resin composition comprising:
(1) at least one epoxy resin having an imide group in its molecular structure, wherein said at least one epoxy resin is capable of undergoing polymerization with bismaleimide and occupies 1.75%-18.0% solids weight of the composition;
(2) at least one bismaleimide compound, wherein said at least one bismaleimide compound occupies 0.15%-12.5% solids weight of the composition;
(3) a radical initiator, wherein said radical initiator is provided in a mole fraction amount of 0.01%-0.15%, based on the total of epoxy resin and bismaleimide compounds;
(4) an inhibitor, wherein said inhibitor is provided in a mole fraction amount of half to double the amount of said initiator, based on the total of epoxy and bismaleimide compounds;
(5) at least one styrene-maleic anhydride copolymer, wherein said at least one styrene-maleic anhydride copolymer occupies 17.5%-47.0% solids weight of the composition;
(6) at least one filler, wherein said at least one filler occupies 20%-60% solids weight of the composition;
(7) at least one solvent, wherein said at least one solvent occupies 30%-50% weight of the composition;
(8) at least one flame retardant.

2. The thermosetting resin composition according to claim 1, wherein said at least one epoxy resin has the following structure:

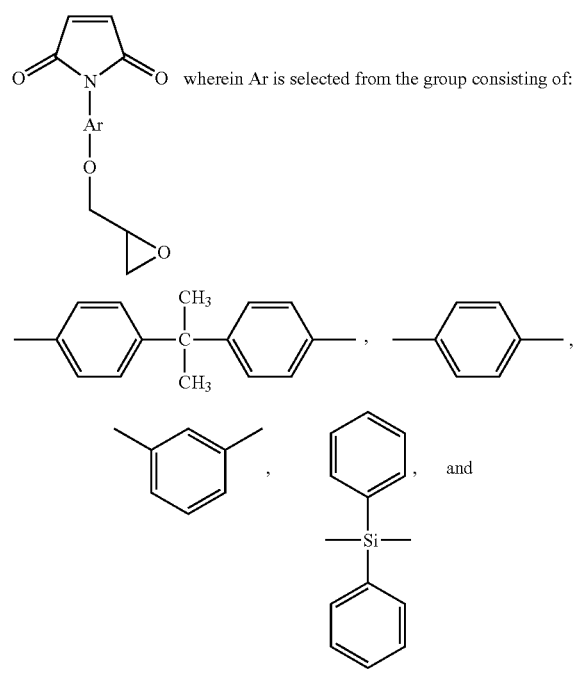

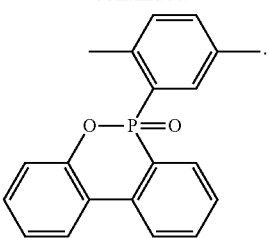

3. The thermosetting resin composition according to claim 1, wherein said at least one epoxy resin occupies 2.2%-14.5% solids weight of the composition.

4. The thermosetting resin composition according to claim 1, wherein said at least one bismaleimide compound has the following structure:

wherein R is selected from the group consisting of

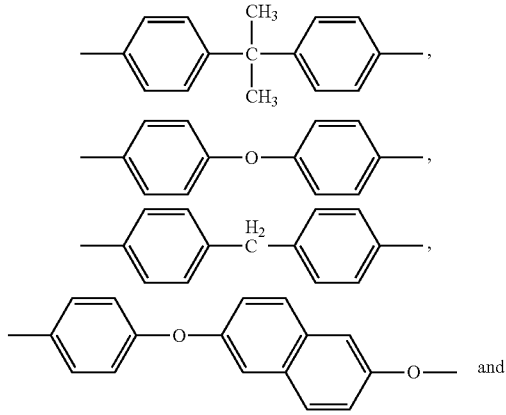

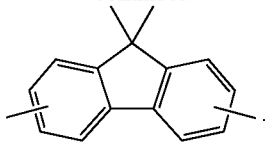

5. The thermosetting resin composition according to claim 1, wherein said at least one bismaleimide compound occupies 1%-10.5% solids weight of the composition.

6. The thermosetting resin composition according to claim 1, wherein said radical initiator is selected from the group consisting of azo compounds, peroxides, and combinations thereof.

7. The thermosetting resin composition according to claim 1, wherein said inhibitor is provided in a mole fraction amount of 0.05%-0.10%, based on the total of epoxy resin and bismaleimide compounds.

8. The thermosetting resin composition according to claim 1, wherein said inhibitor is selected from the group consisting of quinones, aromatic nitro compounds, variable valence metallic salts, phenols, amines, and combinations thereof.

9. The thermosetting resin composition according to claim 1, wherein said at least one styrene-maleic anhydride copolymer has a molecular weight range of 1400-50000.

10. The thermosetting resin composition according to claim 1, wherein said at least one styrene-maleic anhydride copolymer occupies 22.5%-38.0% solids weight of the composition.

11. The thermosetting resin composition according to claim 1, wherein said at least one filler is selected from the group consisting of crystalline silica, melting silica, spherical silica, alumina, mica, talc, boron nitride, aluminum nitride, silicon carbide, diamond, calcined clay, alumina, aluminum nitride fibers, glass fiber, and combinations thereof.

12. The thermosetting resin composition according to claim 1, wherein said at least one solvent is selected from the group consisting of acetone, ketone, methyl isobutyl ketone, cyclohexanone, toluene, dichloromethane, and combinations thereof.

13. The thermosetting resin composition according to claim 1, wherein said at least one flame retardant comprises a brominated Bisphenol A epoxy resin and occupies 5.00%-32.5% solids weight of the composition.

* * * * *